(12) United States Patent
Frenzel et al.

(10) Patent No.: US 11,656,284 B2
(45) Date of Patent: May 23, 2023

(54) METHOD FOR OPERATING A BATTERY SENSOR, AND BATTERY SENSOR

(71) Applicant: Continental Automotive GmbH, Hannover (DE)

(72) Inventors: Henryk Frenzel, Regensburg (DE); Andreas Aumer, Burglengenfeld (DE)

(73) Assignee: Continental Automotive GmbH

( * ) Notice: Subject to any disclaimer, the term of this patent is extended or adjusted under 35 U.S.C. 154(b) by 89 days.

(21) Appl. No.: 16/598,022

(22) Filed: Oct. 10, 2019

(65) Prior Publication Data

US 2020/0116794 A1 Apr. 16, 2020

(30) Foreign Application Priority Data

Oct. 12, 2018 (DE) ...................... 10 2018 217 528.4

(51) Int. Cl.
*G01R 31/374* (2019.01)
*G01R 31/36* (2020.01)

(52) U.S. Cl.
CPC ....... *G01R 31/374* (2019.01); *G01R 31/3644* (2013.01)

(58) Field of Classification Search
None
See application file for complete search history.

(56) References Cited

U.S. PATENT DOCUMENTS

| | | | |
|---|---|---|---|
| 6,028,426 A | 2/2000 | Cameron et al. | |
| 6,870,357 B1 | 3/2005 | Falik | |
| 8,029,187 B2 * | 10/2011 | Taylor | G01K 7/20 374/141 |
| 8,639,460 B2 | 1/2014 | Kang et al. | |
| 9,360,500 B2 | 6/2016 | Schramme et al. | |
| 10,079,408 B2 | 9/2018 | Tzivanopoulos et al. | |
| 10,551,443 B2 | 2/2020 | Shiraishi et al. | |
| 2005/0248351 A1 * | 11/2005 | Graf | G01R 31/382 324/433 |
| 2008/0198898 A1 | 8/2008 | Taylor et al. | |
| 2015/0177291 A1 | 6/2015 | Kageyama et al. | |
| 2016/0223618 A1 | 8/2016 | Yokota | |

(Continued)

FOREIGN PATENT DOCUMENTS

| | | |
|---|---|---|
| CN | 103827674 A | 5/2014 |
| CN | 105652207 A | 6/2016 |

(Continued)

OTHER PUBLICATIONS

German Search Report for German Application No. 10 2018 217 528.4, dated Aug. 28, 2019, 13 pages.

(Continued)

*Primary Examiner* — Nasima Monsur
(74) *Attorney, Agent, or Firm* — RatnerPrestia

(57) ABSTRACT

A method for operating a battery sensor having at least one measuring resistor and at least one voltage capture device for capturing a voltage drop across the measuring resistor and for outputting at least one measured value dependent on the captured voltage drop and an evaluation circuit. The method including determining a correction value for the measured value by the evaluation circuit, and determining a first temperature value of the measuring resistor on the basis of the determined correction value by the evaluation circuit.

10 Claims, 4 Drawing Sheets

(56) References Cited

U.S. PATENT DOCUMENTS

2017/0207496 A1\* 7/2017 Tzivanopoulos . H01M 10/4285
2017/0269184 A1\* 9/2017 Schramme ............. G01R 27/16

FOREIGN PATENT DOCUMENTS

| | | |
|---|---|---|
| CN | 107229028 A | 10/2017 |
| CN | 105467324 A | 4/2018 |
| CN | 109884366 A | 6/2019 |
| DE | 102014213731 A1 | 1/2016 |
| EP | 2623996 A1 | 8/2013 |
| JP | 2002050406 A | 2/2002 |
| JP | 2016138868 A | 8/2016 |
| KR | 20090020470 A | 2/2009 |

OTHER PUBLICATIONS

Chinese Office Action for Chinese Application No. 201910961626.1, dated Aug. 2, 2021, with partial English translation, 14 pages.
Chinese Office Action for Chinese Application No. 201910961626.1, dated Oct. 10, 2022 with translation, 9 pages.
European Examination Report for Application No. 19 201 069.2, dated Nov. 24, 2022 with translation, 10 pages.

\* cited by examiner

METHOD FOR OPERATING A BATTERY SENSOR, AND BATTERY SENSOR

CROSS REFERENCE TO RELATED APPLICATIONS

This application claims priority to German Patent Application No. 10 2018 217 528.4, filed Oct. 12, 2018, the contents of such application being incorporated by reference herein.

FIELD OF THE INVENTION

The invention relates to a method for operating a battery sensor and to a battery sensor.

BACKGROUND OF THE INVENTION

Battery sensors are used in vehicles to capture battery parameters of the vehicle battery in order to be able to make statements on the state of charge and/or the state of health of the battery. The battery sensor is usually arranged at one of the battery poles and has, for example, a battery terminal for making contact with the vehicle battery. The battery parameters to be captured are, for example, the battery voltage, the battery current and the temperature of the battery.

In order to capture the battery current, provision is made, for example, of at least one measuring resistor arranged in the current path of the load current and at least one voltage capture device which can capture the voltage drop of a current flowing via the measuring resistor, for example the load current. If the electrical resistance of the measuring resistor is known, the current flowing via the measuring resistor, that is to say the load current for example, can be determined from the captured voltage drop across the measuring resistor using Ohm's law.

However, the electrical resistance of the measuring resistor can change over the lifetime of the battery sensor and in the event of a temperature change. In order to improve the accuracy of the battery sensor, methods for determining a correction value for the electrical resistance of the measuring resistor and/or the captured voltage drop across the measuring resistor are known from the prior art. This correction value can be used to computationally compensate for a change in the electrical resistance of the measuring resistor.

The temperature of the battery sensor is determined, for example, using a temperature sensor which is arranged in the battery sensor and is connected to a component of the battery sensor which is connected to the battery in a thermally conductive manner.

For example, the temperature sensor is arranged on the measuring resistor. However, the secure fastening of the temperature sensor to the measuring resistor is very complicated and requires additional work steps when mounting the battery sensor.

Alternatively, the temperature sensor is arranged on a printed circuit board on which the voltage capture device and an evaluation circuit are situated. In such an embodiment, the temperature sensor is coupled to the measuring resistor, for example via contacts which have very good thermal conductivity. If the measuring resistor heats up, the contacts and therefore the temperature sensor are heated.

Irrespective of the position of the temperature sensor, these systems react relatively sluggishly on account of the spatial distance between the temperature sensor and the vehicle battery. In addition, the inaccuracy of the temperature capture process can increase with increasing distance between the temperature sensor and the vehicle battery, for example on account of other temperature influences.

SUMMARY OF THE INVENTION

An aspect of the invention is a method for operating a battery sensor and a battery sensor which make it possible to reliably and accurately determine the temperature of the measuring resistor and therefore to measure battery parameters in a more accurate manner.

In one aspect of the invention, a method for operating a battery sensor is provided, wherein the battery sensor has at least one measuring resistor and at least one voltage capture device for capturing a voltage drop across the measuring resistor and for outputting at least one measured value dependent on the captured voltage drop and an evaluation circuit. The method has the following steps of:

determining a correction value for the measured value by means of the evaluation circuit, and determining a first temperature value of the measuring resistor on the basis of the determined correction value by means of the evaluation circuit.

The electrical resistance of the measuring resistor is temperature-dependent, inter alia. That is to say, a temperature change in the battery, which also has an effect on the measuring resistor thermally coupled to the battery, results in a change in the electrical resistance of the measuring resistor. In order to compensate for this change in the electrical resistance, a correction value for the electrical resistance of the measuring resistor and/or for the captured voltage drop across the measuring resistor is usually determined by the evaluation circuit. This correction value makes it possible to determine the current flowing via the measuring resistor in a substantially more accurate manner since a change in the electrical resistance of the measuring resistor can be computationally compensated for.

The temperature dependence of the correction value is then used to determine the temperature of the measuring resistor.

The relationship between the temperature and the correction value is determined in advance and is stored in a memory of the evaluation circuit, for example. If the correction value is known, the temperature value corresponding to this correction value can be determined from the data stored in the memory. Therefore, there is no need for a separate temperature sensor. Since the temperature of the measuring resistor, which is in direct contact with the vehicle battery, is also determined, there is the slightest possible delay when determining the temperature and the influence of further external factors on the temperature capture is minimized. As a result of the method described above, the change in the electrical resistance of the measuring resistor or the state of the measuring resistor is directly used to determine the temperature or a temperature value.

Various methods are known for determining the correction value. It is only necessary to determine a correction value for the electrical resistance of the measuring resistor and/or for the captured voltage drop across the measuring resistor and to compare this with a previously determined relationship between the correction value and the temperature.

For example, in order to determine the correction value, it is possible to use a reference current method which has the following steps of:

applying a reference current of known magnitude to the measuring resistor, capturing a voltage drop caused by the reference current and/or a change in the voltage drop caused by the reference current, determining the correction value on the basis of the voltage drop caused by the reference current and/or the change in the voltage drop caused by the reference current.

The reference current is briefly applied to the measuring resistor and the voltage drop or the change in the voltage drop across the measuring resistor on account of the reference current is determined using the voltage capture device. The actual electrical resistance of the measuring resistor can be determined from the voltage drop caused by the reference current or the change in the voltage drop and the known reference current. The correction value can be determined from a comparison with the theoretical resistance or the electrical resistance of the measuring resistor stored in a memory.

This method has the advantage that there is no need to interrupt the current or voltage measurement. It is only necessary for the voltage drop or the change in the voltage drop on account of the reference current to be able to be separated from the voltage drop caused by the load current.

In addition, no further components, in particular no additional sensors, are required from the reference current source.

In the case of a battery sensor having at least one first measuring resistor and one second measuring resistor arranged in series with the latter, each with at least one voltage capture device for capturing a voltage drop across the respective measuring resistor, the method may additionally have the following steps of:

applying a reference current of known magnitude to a first measuring resistor, capturing the voltage drops across the first measuring resistor and across the second measuring resistor using the voltage capture devices, comparing the voltage drops across the first measuring resistor and across the second measuring resistor and determining the voltage drops on account of the load current and the reference current.

In this embodiment, the reference current is applied only to one of the measuring resistors. Accordingly, the voltage drop is changed only at this measuring resistor, whereas the voltage drop at the other measuring resistor is caused only by the load current. By comparing the two voltage drops, it is possible to computationally separate the voltage drop at the first measuring resistor on account of the reference current from the voltage drop on account of the load current. As a result, it is possible to accurately determine the voltage drop on account of the reference current, with the result that the electrical resistance of the first measuring resistor or a correction value for the electrical resistance of the first measuring resistor can be accurately determined using the known reference current and the determined voltage drop.

This method provides advantages, in particular, if the load current fluctuates greatly. By means of a comparison with the voltage drop at the second measuring resistor, it is possible to assess whether a change in the voltage drop at the first measuring resistor is caused by a change in the load current or by the application of the reference current, with the result that the voltage drop on account of the reference current can be accurately determined.

A second temperature value can be optionally captured, and a temperature correction value for the first temperature value can be determined on the basis of the second temperature value. Comparing the first temperature value with the second temperature value makes it possible to determine the temperature in a more accurate manner. For example, the influence of other factors which influence the electrical resistance of the measuring resistor can thus be minimized.

Furthermore, the method in which two temperature values are determined and compared with one another in the manner described above can be used for the self-diagnosis of the battery sensor, in particular the determination of the temperature of the battery sensor. In this case, the determination of the first temperature value can be used to check the correct function of the capture of the second temperature value, in particular the correct function of a temperature sensor. On the other hand, as already described, the second temperature value can be used to check and correct the first temperature value.

The second temperature value is captured, for example, using a sensor, in particular using a temperature sensor.

In order to achieve the object, a battery sensor for capturing battery parameters, in particular of a vehicle battery, is also provided, having at least one measuring resistor, having at least one voltage capture device for capturing a voltage drop across the measuring resistor and for outputting at least one measured value dependent on the captured voltage drop, and having an evaluation circuit, wherein the evaluation circuit is designed to determine a correction value for the measured value and to determine a first temperature value of the measuring resistor on the basis of the determined correction value, in particular using a method according to an aspect of the invention.

For the purpose of determining the correction value, the battery sensor may have at least one reference current device for applying a reference current of known magnitude to the measuring resistor. The determination of the correction value using the reference current device is carried out, for example, using the method described above.

Optionally, the battery sensor may also have a first measuring resistor and a second measuring resistor arranged in series with the latter, each with at least one voltage capture device for capturing a voltage drop across the respective measuring resistor.

The battery sensor may additionally have a temperature sensor for determining a second temperature value, wherein the evaluation circuit is designed to determine a temperature correction value for the first temperature value on the basis of the second temperature value.

BRIEF DESCRIPTION OF THE DRAWINGS

Further advantages and features are found in the following description in conjunction with the accompanying drawings, in which.

DETAILED DESCRIPTION OF THE PREFERRED EMBODIMENTS

Figure 1:
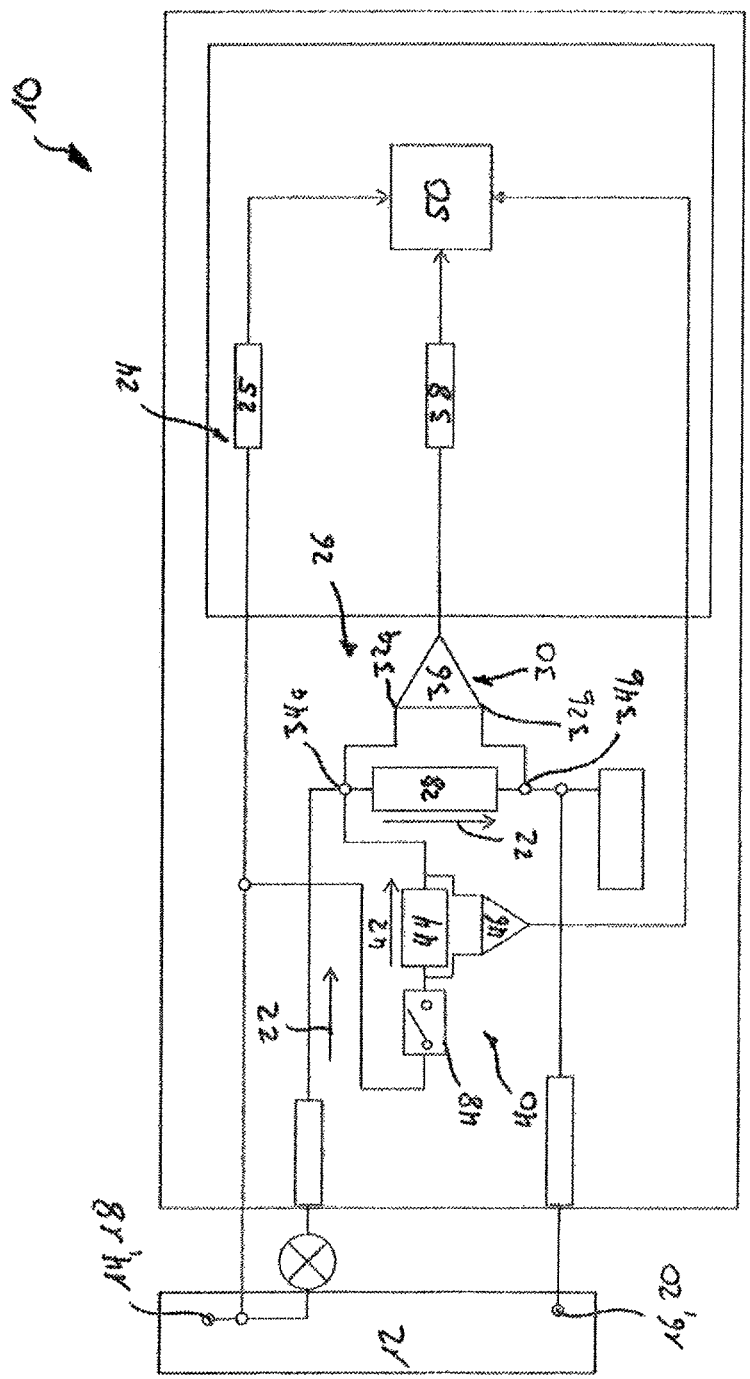
FIG. 1 shows a battery sensor according to an aspect of the invention.

FIG. 1 shows a schematic illustration of a battery sensor 10 for a battery 12, in particular a vehicle battery. The battery sensor 10 has a first connection 14 and a second connection 16 for making contact with the poles 18, 20 of the battery 12 and is arranged in the load current path 22 of the vehicle, with the result that the load current 22 of the vehicle flows through the battery sensor 10.

In the embodiment shown, the battery sensor 10 may determine three battery parameters, the temperature of the measuring resistor, the battery voltage and the load current, in order to make statements on the state of charge and the state of health of the battery 12.

For this purpose, the battery sensor 10 has a voltage measuring device 24 which is in contact with the first connection 14 in order to capture the battery voltage. The voltage measuring device 24 additionally has an analog/digital converter 25 for digitizing the measurement signals. Optionally, the voltage measuring device 24 may also have an amplifier for the measurement signal.

A current measuring device 26 for determining the load current 22 is also provided.

The current measuring device 26 has a measuring resistor 28, which is arranged in the load current path and through which the load current 22 flows, and a voltage capture device 30, the inputs 32a, 32b of which are each in contact with a contact point 34a, 34b upstream and downstream of the measuring resistor 28.

The measuring resistor 28 consists, for example, of a material having a thermal dependence of the electrical resistance. That is to say, a temperature change in the measuring resistor has at least a slight influence on the electrical resistance of the measuring resistor. The measuring resistor 28 can consist of copper or a copper alloy, for example.

The voltage capture device 30 captures the voltage drop between the contact points 34a, 34b, that is to say the voltage drop across the measuring resistor 28. The voltage capture device 30 also has an amplifier 36 and an analog/digital converter 38.

With a known electrical resistance of the measuring resistor 28, the load current 22 can be determined using the captured voltage drop across the measuring resistor 28 from Ohm's law (I=U/R).

However, the electrical resistance of the measuring resistor 28 may change during operation of the battery sensor 10. For example, the electrical resistance of the material of the measuring resistor 28 may change on the basis of the temperature. Furthermore, aging-related or environment-related changes in the electrical resistance of the measuring resistor 28 may occur.

It is therefore necessary to determine a correction value for the voltage drop captured using the voltage capture device 26 during operation of the battery sensor 10.

A reference current device 40 is provided for this purpose and can be used to provide a reference current 42 of known magnitude. The reference current device 40 has a reference current resistor 44, a voltage capture device 46 and a switch 48. The reference current resistor 44 is a highly accurate resistor, preferably made of a material having a low temperature dependence. The reference current device 40 is connected to the first contact point 34a, with the result that the reference current 42 can be fed into the first contact point 34a by closing the switch 48 and can therefore be applied to the measuring resistor 28. The voltage capture device 46 can be used to determine the voltage drop at the reference current resistor 44. The reference current can be determined very accurately using this voltage drop and the known electrical resistance of the reference current resistor 44.

In order to determine a correction value, a reference current 42 of known magnitude is briefly applied to the measuring resistor 28 using the reference current device 40. The change in the voltage drop on account of the reference current 42 applied in addition to the load current 22 can be determined using the voltage capture device 26 and the exact electrical resistance of the measuring resistor 28 or a correction value for the captured voltage drop can be determined therefrom. If the reference current device 40 is then separated from the measuring resistor 28 by opening the switch 48, the voltage drop subsequently captured can be corrected using the determined correction value.

The captured values from the voltage measuring device 24 and from the current measuring device 26 are evaluated in an evaluation circuit 50 in order to be able to make statements on the state of charge and the state of health of the battery 12.

In order to be able to completely assess the state of the battery 12, it is additionally necessary to capture the battery temperature. In the prior art, this is usually carried out using a temperature sensor which is arranged, for example, on the measuring resistor 28 or on a printed circuit board.

In the battery sensor 10 shown in FIG. 1, the temperature is determined instead from the captured voltage drop across the measuring resistor 28.

As already explained, the electrical resistance of the measuring resistor 28 is temperature-dependent. The relationship between the temperature and the electrical resistance of the measuring resistor 28 is determined in advance and is stored in the evaluation circuit 50. For a determined corrected electrical resistance of the measuring resistor 28 or for a determined correction value, the temperature of the measuring resistor 28 can therefore be determined from the previously determined relationship.

Figure 2:
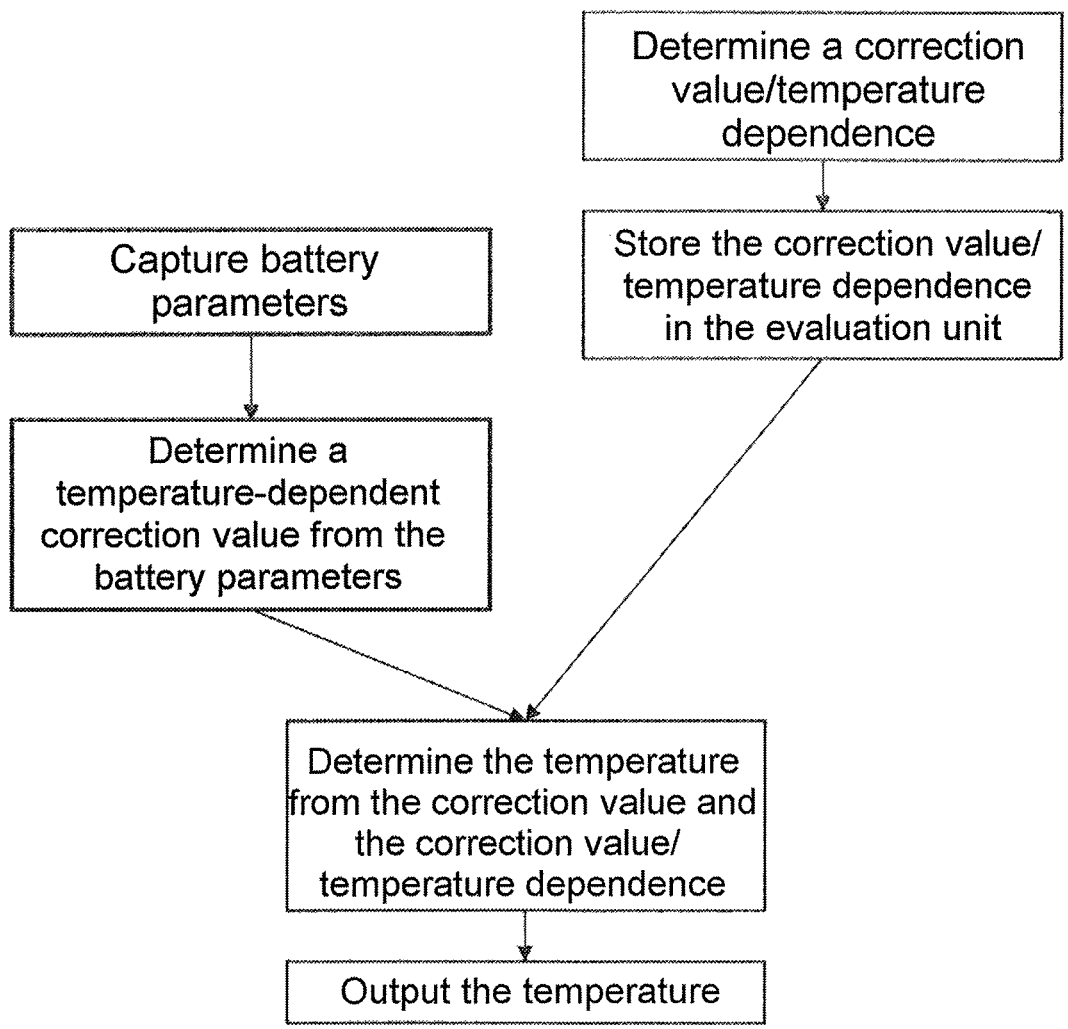
FIG. 2 shows a flowchart for operating the battery sensor from FIG. 1.

In order to determine the temperature, a correction value for the voltage drop captured by the voltage capture device 26 is therefore determined. The instantaneous temperature of the measuring resistor 28 is then determined from this correction value or the determined electrical resistance of the measuring resistor 28 corrected using this correction value and the previously determined relationship between the electrical resistance of the measuring resistor 28 and the temperature. Since the measuring resistor is connected to the battery pole in an electrically and thermally conductive manner, this temperature can be used to determine the battery temperature (FIG. 2).

An additional temperature sensor is therefore not needed to determine the temperature. A signal from the temperature sensor of the evaluation circuit 50 therefore also does not need to be processed. It is only necessary to determine a correction value for the electrical resistance of the measuring resistor 28 or the corrected electrical resistance of the measuring resistor 28. In the embodiment shown here, this is carried out by applying a reference current 42 of known magnitude. In principle, however, it is possible to use any suitable method which is suitable for determining a correction value for the electrical resistance of the measuring resistor 28 or the corrected electrical resistance of the measuring resistor 28.

The battery sensor 10 may also have, for example, a plurality of measuring resistors 28 which may be arranged in parallel or in series, wherein a plurality of voltage capture devices 26 for capturing the individual voltage drops across the measuring resistors 28 may also be provided. In such an embodiment, the reference current may be conducted only through individual ones of the measuring resistors 28, for example, in order to be able to better distinguish or separate the voltage drops on account of the reference current and on account of the load current from one another.

Figure 3:
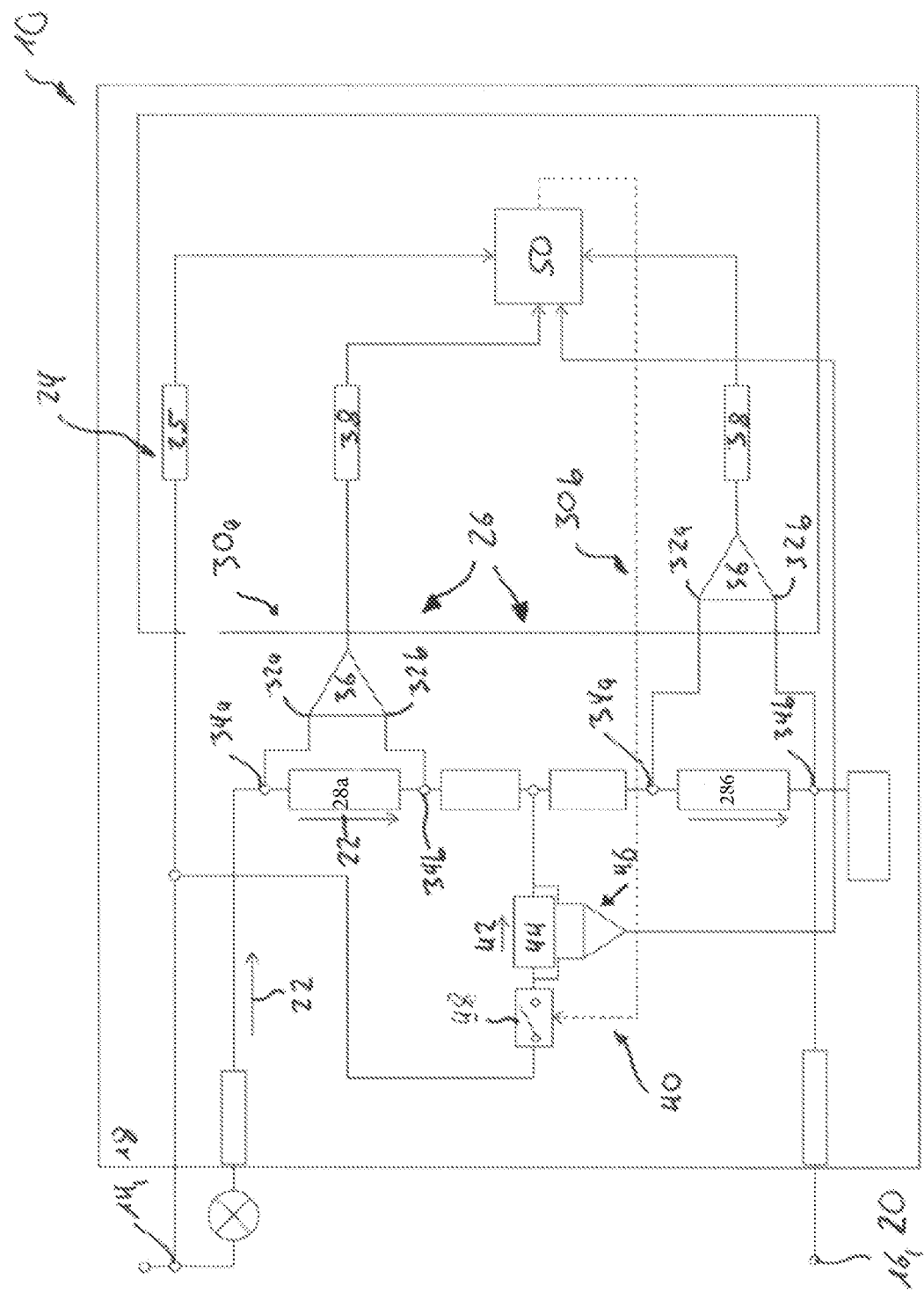
FIG. 3 shows a second embodiment of a battery sensor according to an aspect of the invention.

FIG. 3 shows, for example, an embodiment having two measuring resistors 28a, 28b arranged in series. In this embodiment, the reference current 42 is fed in between the two measuring resistors 28a, 28b arranged in series, that is to say, to a certain extent, is applied only to one of the two measuring resistors 28a. If the reference current 42 is applied, only the voltage drop across the measuring resistor 28a is therefore changed, whereas the voltage drop at the second measuring resistor 28b is caused solely by the load current. The voltage drop caused by the reference current 42 at the first measuring resistor 28a can be filtered out by comparing the two voltage drops or the temporal profiles of the two voltage drops.

This method is particularly advantageous if the load current fluctuates greatly, with the result that it is difficult to distinguish whether a change in the voltage drop is caused solely by the reference current 42 or by a change in the load current. A change in the load current 22 results in a change in the voltage drop at both measuring resistors 28a, 28b, whereas a change in the voltage drop caused by the reference current 42 affects only the first measuring resistor 28a.

Figure 4:
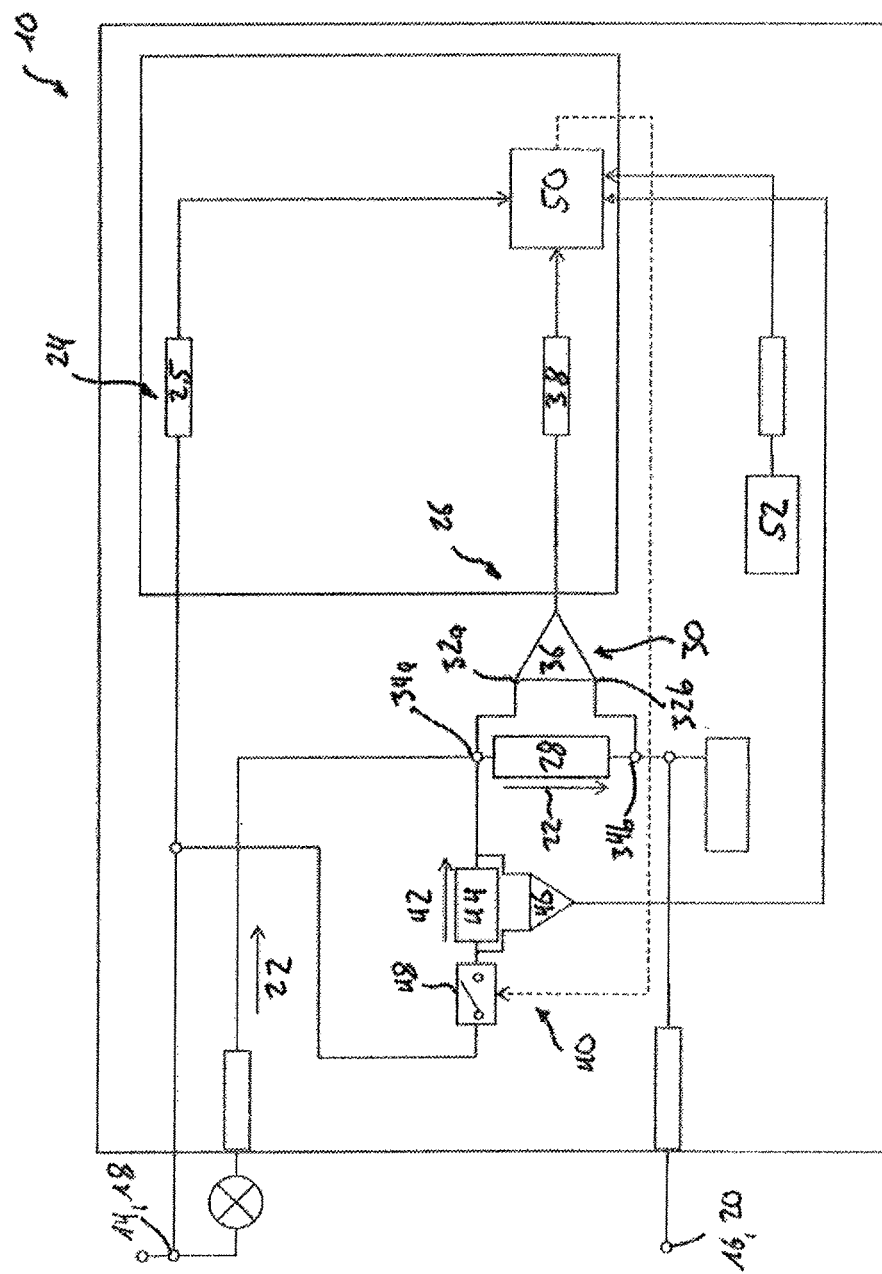
FIG. 4 shows a third embodiment of a battery sensor according to an aspect of the invention.

The battery sensor 10 shown in FIG. 4 corresponds substantially to the battery sensor 10 shown in FIG. 1. This battery sensor additionally has a temperature sensor 52 which is connected to the evaluation circuit 50. The temperature sensor is arranged in the battery sensor, for example on the printed circuit board on which the evaluation circuit 50 is arranged, or on the measuring resistor 28. The temperature sensor 52 may output a second temperature value to the evaluation circuit.

The simultaneous capture of a first temperature value and a second temperature value can be used, for example, to improve the accuracy of the temperature determination. The second temperature value may be used, for example, to determine a correction value for the first temperature value in order to compensate for aging effects, for example.

Alternatively, the first temperature value can be used to subject the second temperature value determined using the temperature sensor 52 to a plausibility check. In the case of a defined deviation between the first temperature value and the second temperature value, a fault signal can be output, for example, and/or a correction value for the second temperature value is determined.

LIST OF REFERENCE SIGNS

10 Battery sensor
12 Battery
14 First connection
16 Second connection
18 Battery pole
20 Battery pole
22 Load current path
24 Voltage measuring device
25 Analog/digital converter
26 Current measuring device
28 Measuring resistor
28a Measuring resistor
28b Measuring resistor
30 Voltage capture device
30a Voltage capture device
30b Voltage capture device
32a Input of the voltage capture device
32b Input of the voltage capture device
34a Contact point
34b Contact point
36 Amplifier
38 Analog/digital converter
40 Reference current device
42 Reference current
44 Reference current resistor
46 Voltage capture device
48 Switch
50 Evaluation circuit
52 Temperature sensor

The invention claimed is:

1. A method for operating a battery sensor, wherein the battery sensor has at least one current measuring resistor, at least one voltage capture device and an evaluation circuit, the method comprising:
   capturing, by the at least one voltage capture device, a voltage drop across the at least one current measuring resistor caused by a load current flowing from a first pole of a battery to a second pole of the battery through electrical connections of the battery sensor that are in contact with the first pole of the battery and the second pole of the battery, the at least one current measuring resistor of the battery sensor configured to measure the load current flowing from the first pole of the battery to the second pole of the battery,
   determining, by the evaluation circuit, a correction value for the voltage drop, the correction value varying in accordance with a relationship to a temperature of the at least one current measuring resistor,
   wherein determining the correction value comprising:
      applying a reference current of known magnitude to the at least one current measuring resistor using a reference current device;
      determining a change in the voltage drop on account of the reference current applied in addition to the load current using the voltage capture device; and
      determining the correction value for the captured voltage drop;
   after determining the correction value, determining, by the evaluation circuit, without using a temperature sensor, a first temperature value of the at least one current measuring resistor on the basis of the relationship between the determined correction value and the temperature of the at least one current measuring resistor;
      wherein an electrical resistance of the at least one current measuring resistor is temperature-dependent;
      determining the relationship between the temperature and the electrical resistance of the at least one current measuring resistor in advance;
      storing the relationship in the evaluation circuit; and
      determining for the determined correction value, the temperature of at least one measuring resistor from the previously determined relationship.

2. The method as claimed in claim 1, further comprising:
   applying a reference current of known magnitude to the current measuring resistor, capturing a voltage drop caused by the reference current and/or a change in the voltage drop caused by the reference current, and
   determining the temperature value on the basis of the voltage drop caused by the reference current and/or the change in the voltage drop caused by the reference current.

3. The method as claimed in claim 2, wherein the battery sensor has at least one first current measuring resistor and one second current measuring resistor arranged in series with the latter, each with at least one voltage capture device for capturing a voltage drop across the respective current measuring resistor, comprising:

applying a reference current of known magnitude to the first current measuring resistor, capturing the voltage drops across the first current measuring resistor and across the second current measuring resistor using the voltage capture devices, and comparing the voltage drops across the first current measuring resistor and across the second current measuring resistor and determining the voltage drops on account of the load current and the reference current.

4. The method as claimed in claim 1, further comprising:

capturing a second temperature value, and determining a temperature correction value for the first temperature value on the basis of the second temperature value.

5. The method as claimed in claim 4, wherein the second temperature value is captured using a temperature sensor.

6. A battery sensor for capturing a voltage of a battery, having at least one current measuring resistor, having at least one voltage capture device for capturing a voltage drop across the current measuring resistor and for outputting at least one measured value dependent on the captured voltage drop, and having an evaluation circuit, wherein the evaluation circuit is designed to determine a correction value for the measured value and to determine a first temperature value of the current measuring resistor on the basis of the determined correction value, using a method as claimed in claim 1.

7. The battery sensor as claimed in claim 6, wherein the battery sensor has at least one reference current device for applying a reference current of known magnitude to at least one current measuring resistor.

8. The battery sensor as claimed in claim 6, wherein the battery sensor has at least one first current measuring resistor and one second current measuring resistor arranged in series with the latter, each with at least one voltage capture device for capturing a voltage drop across the respective current measuring resistor.

9. The battery sensor as claimed in claim 6, wherein the battery sensor has a temperature sensor for determining a second temperature value, wherein the evaluation circuit is designed to determine a temperature correction value for the first temperature value on the basis of the second temperature value.

10. The battery sensor as claimed in claim 7, wherein the battery sensor has at least one first current measuring resistor and one second current measuring resistor arranged in series with the latter, each with at least one voltage capture device for capturing a voltage drop across the respective current measuring resistor.

\* \* \* \* \*